United States Patent
Shoei

(10) Patent No.: US 6,319,314 B1
(45) Date of Patent: Nov. 20, 2001

(54) METHOD AND DEVICE FOR MANUFACTURING SPHERICAL SEMICONDUCTOR CRYSTALS

(75) Inventor: Kurosaka Shoei, Hiratsukashi (JP)

(73) Assignee: Komatsu Electronics Co., Ltd., Kanagawa (JP)

( * ) Notice: Subject to any disclaimer, the term of this patent is extended or adjusted under 35 U.S.C. 154(b) by 0 days.

(21) Appl. No.: 09/457,441

(22) Filed: Dec. 8, 1999

(30) Foreign Application Priority Data

Dec. 10, 1998 (JP) .................................................. 10-351633

(51) Int. Cl.[7] .................................................... C30B 35/00
(52) U.S. Cl. ............................................................. 117/117
(58) Field of Search ..................................... 117/200, 206

(56) References Cited

U.S. PATENT DOCUMENTS

| | | | | |
|---|---|---|---|---|
| 6,004,396 | * | 12/1999 | Ishikawa | 118/715 |
| 6,074,476 | * | 6/2000 | Hananbe et al. | 117/11 |
| 6,106,739 | * | 8/2000 | Stephens et al. | 252/62.3 R |
| 6,120,602 | * | 9/2000 | Stephens et al. | 117/200 |
| 6,153,007 | * | 11/2000 | Nakata | 117/11 |
| 6,203,658 | * | 3/2001 | Ishikawa | 156/345 |
| 6,204,545 | * | 3/2001 | Nakata | 257/459 |

FOREIGN PATENT DOCUMENTS

| | | | | |
|---|---|---|---|---|
| 0866506-A1 | * | 4/1998 | (EP) | H01L/31/042 |
| 169279-A | * | 6/2000 | (JP) | C30B/11/00 |

* cited by examiner

Primary Examiner—Benjamin L. Utech
Assistant Examiner—Matthew A. Anderson
(74) Attorney, Agent, or Firm—Powell, Goldstein, Frazer & Murphy LLP

(57) ABSTRACT

The present invention provides a method and a device capable of manufacturing spherical semiconductor crystals continuously without contamination. A bar-shaped semiconductor material 64a is connected to a supporting member (wire 50) and descends at a preset speed. The bar-shaped semiconductor material 64a is preheated by the preheating portion 56c of a heater 56 to a predetermined temperature. Afterward, the preheated bar-shaped semiconductor material 64a further descends, and the surface of the semiconductor material melts through heating of the melting portion 56d of the heater 56 to form liquid drops 64b. The liquid drops 64b accumulate at the lower end of the bar-shaped semiconductor material 64a and drop down by their own weights. The liquid drops 64b cool down during free fall and become solid spherical semiconductor crystals 64c without deformation. An impact absorbing material 62 absorbs the impact of the falling spherical semiconductor crystals 64c and retains them. Therefore, spherical semiconductor crystals 64c can be continuously produced by melting the bar-shaped semiconductor material 64a and dropping liquid drops 64b.

9 Claims, 8 Drawing Sheets

METHOD AND DEVICE FOR MANUFACTURING SPHERICAL SEMICONDUCTOR CRYSTALS

BACKGROUND OF THE INVENTION

1. Field of the Invention

This invention relates to a method and a device for manufacturing semiconductors. More particularly, the present invention relates to a method and a device for manufacturing spherical semiconductor crystals.

2. Description of the Prior Art

Conventionally, spherical semiconductor crystals are manufactured by buoying small pieces of semiconductor material with the aid of electromagnetic floating coils and at the same time heating them to obtain liquid drops. The liquid drops are solidified during free fall, and spherical semiconductor crystals are thus obtained. A method for manufacturing spherical semiconductor crystals has been disclosed in U.S. Pat. No. 4,322,379. In this patent, bar-shaped or scrap material for producing spherical semiconductor crystals is fed into a quartz tube that is provided with a nozzle at its distal end. After the bar-shaped or scrap material is melted through a coil-heating process, liquid drops are forced to drop down from the distal end of the nozzle by applying a gas pressure. Then, the liquid drops are solidified during free fall, and spherical semiconductor crystals are thus obtained.

However, the following problems remain unsolved in the above-described methods. In the process of buoying and heating small pieces of semiconductor material, a plurality of small pieces of semiconductor material are supplied into a region above the electromagnetic floating coils for heating. However, this process still takes too much time to produce spherical semiconductor crystals. Moreover, the quartz tube employed in the '379 patent deteriorates after several operations. This will cause a hindrance to uninterrupted production of spherical semiconductor crystals. Furthermore, under this process it is required to heat the quartz tube so as to melt the material. The above heating process will fuse the quartz tube and impurities contained in quartz will blend into the liquid drops. Therefore, it is quite difficult to maintain the purity of the produced semiconductor crystals.

SUMMARY OF THE INVENTION

The object of the present invention is to provide a method and a device for manufacturing spherical semiconductor crystals capable of solving the above-mentioned problems and performing continuous production of spherical semiconductor crystals whose purity is maintained. In addition, the deterioration of the device can be prevented.

To achieve the above-mentioned object, in the method for manufacturing spherical semiconductor crystals according to this invention, the melt portion of a buoying semiconductor material is heated to melt so as to obtain spherical semiconductor crystals by solidifying the drops during free fall, and the semiconductor material is conducted to descend toward its melt portion in response to the amount of the semiconductor material dropped. During the preliminary stage of the heating-and-melting process, the semiconductor material is preheated. The semiconductor material is in the shape of a bar. The lower end of the semiconductor material is sharpened. The semiconductor material is driven to rotate at a preset speed while being heated and melted. Dopants are blended into the semiconductor material in a preset proportion. Doping gas is mixed in a preset proportion into the surroundings of the liquid drops melted from the semiconductor material. Alternatively, a solution containing subject impurities is spread over an unblemished semiconductor material, in which no subject impurities are contained.

According to this invention, the device for manufacturing spherical semiconductor crystals comprises: A supporting member for supporting semiconductor material in a manner capable of ascending/descending at a preset speed; a heater disposed in a manner such as not to be in contact with the semiconductor material, the heater being used for melting the semiconductor material to allow the melted liquid to drop down; a manufacturing room for allowing the liquid drops to solidify during free fall; and a controller for conducting the semiconductor material to descend toward the heater with the aid of the supporting member in response to the amount of the semiconductor material dropped. Furthermore, the lower portion of the manufacturing room is provided with an impact absorbing member used for absorbing the impact of the falling spherical semiconductor crystals solidified from the liquid drops and for retaining them. The semiconductor material is in the shape of a bar. Moreover, the lower end of the semiconductor material is sharpened. The lower end of the heater is devised as a melting portion and is sharpened in the same way as the lower end of the semiconductor material, and the upper section of the melting portion is employed for preheating the semiconductor material. Moreover, the clamping portion of the supporting member is made of carbon-fiber-reinforced carbon material having a melting point higher than that of semiconductor material or metals with high melting points. Moreover, the heat-emission body in the melting portion of the heater has a double-spiral shape. Moreover, the supporting member is provided with a rotation mechanism capable of rotating the semiconductor material at a preset speed. A doping gas source is communicated with the manufacturing room.

In the above-described structure, the semiconductor material, made, for example, of silicon, is connected to the supporting member and is conducted to descend at a preset speed. Then, the heater melts the surface of the semiconductor material to form liquid drops. The liquid drops accumulate at the lower end of the semiconductor material and drop down by their own weight. The liquid drops cool down within the manufacturing room during free fall and become solid spheres without deformation. Moreover, the semiconductor material is conducted to descend toward the heater by the controller, and spherical semiconductor crystals can be continuously produced by melting the semiconductor material and dropping liquid drops. Therefore, there is no need to store liquid drops temporarily and puff them out from the distal end of the nozzle by applying a gas pressure, as in the conventional method. Moreover, quartz storage parts or graphite susceptors are no longer required and cost can thus be reduced. Moreover, the semiconductor material is melted through a non-contact process, therefore spherical semiconductor crystals of high purity can be produced. Moreover, because there is no need of quartz storage parts, it is possible to eliminate the possibility of breakdown induced by deterioration of quartz members in the spherical semiconductor crystal-manufacturing device.

Furthermore, preheating the semiconductor material in the preliminary stage of the heating-and-melting process can prevent breakage of the semiconductor material induced by heat expansion. Therefore, spherical semiconductor crystals can be continuously produced.

Furthermore, damage of spherical semiconductor crystals can be avoided by absorbing the impact of the falling spherical semiconductor crystals with the aid of an impact absorbing member installed within the lower portion of the manufacturing room.

Furthermore, compared with small pieces of semiconductor material, the surface of bar-shaped semiconductor material is smaller. Because bar-shaped semiconductor material is used, the semiconductor material can be maintained in an uncontaminated state and spherical semiconductor crystals can be continuously produced.

Furthermore, the lower ends of the semiconductor material and the heater are sharpened, therefore the liquid drops can be collected at a determined site and can then be conducted to drop down onto a predetermined locality. Moreover, melted liquid will accumulate at the distal end of the bar-shaped material and then convert into liquid drops during the melting process, therefore melted liquid drops of the same shape can be continuously produced. Consequently, spherical semiconductor crystals can be continuously and directly produced from semiconductor material.

Furthermore, the clamping portion of the supporting member is made of carbon-fiber-reinforced carbon material having a melting point higher than that of semiconductor material or metals with high melting points, therefore heat damage such as distortion of the clamping portion can be eliminated.

Furthermore, the heat-emission body in the melting portion of the heater is in a double-spiral shape, therefore the heating efficiency of the heater is enhanced and the semiconductor material can be melted into liquid drops in an efficient way.

Furthermore, the supporting member is provided with a rotation mechanism capable of rotating the semiconductor material at a preset speed, therefore the semiconductor material is driven to rotate at a preset speed while being heated and melted. As a result, bar-shaped semiconductor material can be uniformly heated and melted.

Furthermore, doping gases can be fed into the manufacturing device through doping gas source communicated therewith, therefore the resistivity of spherical semiconductor crystals can be adjusted to produce p type or n type spherical semiconductor crystals.

Furthermore, the resistivity of spherical semiconductor crystals can be adjusted so as to produce p type or n type spherical semiconductor crystals easily by mixing dopants into semiconductor material beforehand.

BRIEF DESCRIPTION OF THE DRAWINGS

The present invention will become more fully understood from the detailed description given hereinafter and the accompanying drawings, given by way of illustration only and thus not intended to be limiting of the present invention.

DETAILED DESCRIPTION OF THE INVENTION

The embodiments will be described in detail with reference made to the accompanying drawings. In the embodiments, bar-shaped semiconductor materials with sharpened lower ends are raised and/or lowered by supporting members (wires) and heated to melt by a heater disposed in a manner such as not to be in contact with the semiconductor material so as to produce spherical semiconductor crystals.

Figure 4:
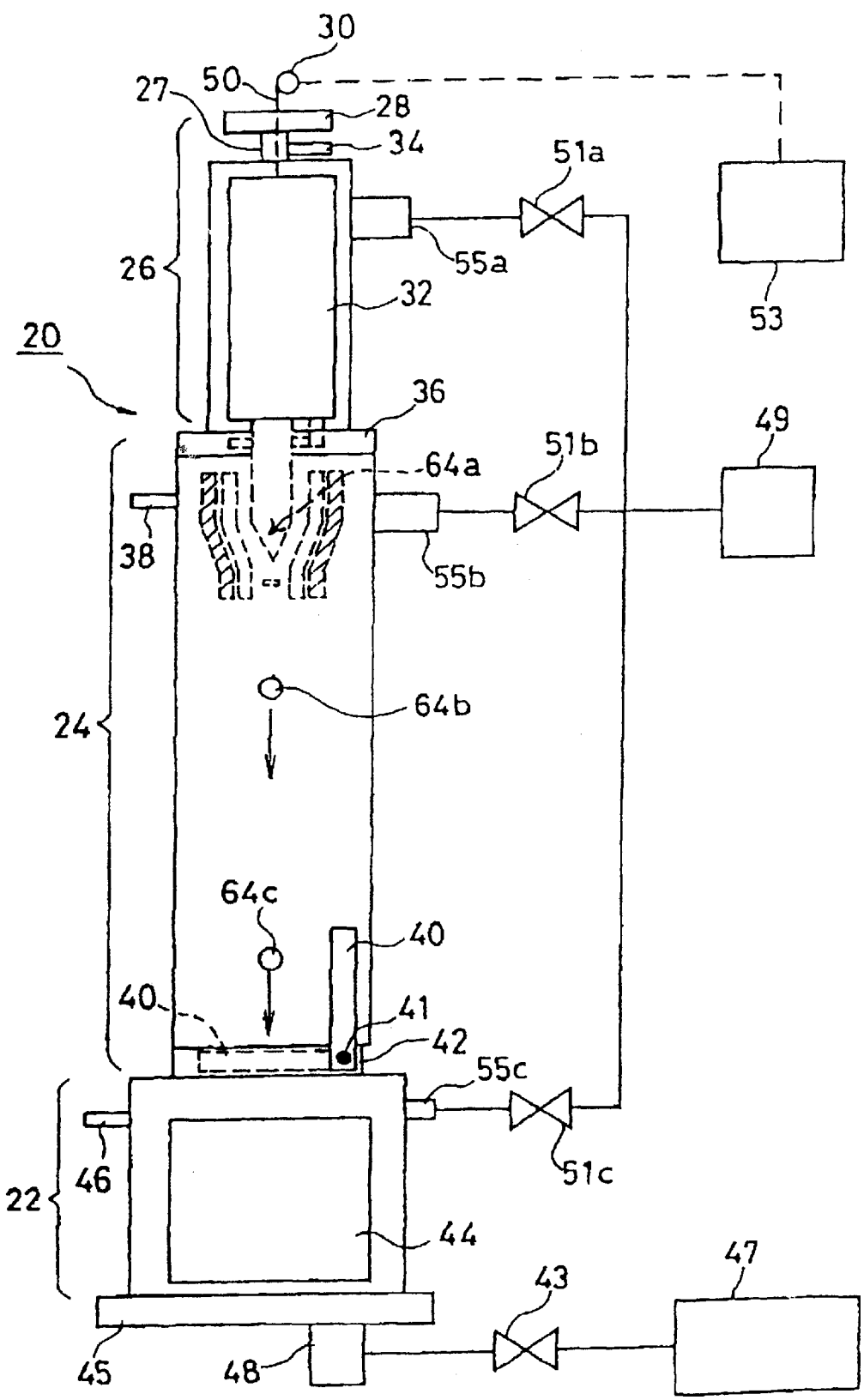
FIG. 4 is an illustration showing the outer periphery of the first embodiment of the device for manufacturing spherical semiconductor crystals according to this invention.

FIG. 4 is an illustration showing the outer periphery of an embodiment of the device 20 for manufacturing spherical semiconductor crystals according to this invention. In the above device 20, a manufacturing room 24, in the shape of a rectangular prism extending upward to a bar-shaped semiconductor material 64a made of silicon, is disposed on a cubic retaining room 22. The bar-shaped semiconductor material 64a is melted to produce spherical semiconductor crystals 64c, which are retained within the retaining room 22. A material room 26 in the shape of a rectangular prism, into which the bar-shaped semiconductor material 64a is inserted, is disposed on the manufacturing room 24.

A wire-winding device 30, on which a wire 50 is winded, is disposed above the material room 26 via a cylinder 27. A material room door 32 for inserting the bar-shaped semiconductor material 64a into the material room 26 is installed on the front surface of the material room 26. Furthermore, a protruded gas inlet-port 34, namely the passage for guiding inert gas into the material room 26, is installed in the lateral surface of the cylinder 27.

A gate chamber 36 capable of cutting off communication between the manufacturing room 24 and the material room 26 is disposed on the upper surface, which adjoins the material room 26 of the manufacturing room 24. A protruded gas inlet-port 38 for guiding inert gas into the manufacturing room 24 is installed in the upper lateral surface of the material room 26. A gate chamber 42 capable of cutting off communication between the manufacturing room 24 and the retaining room 22 is disposed at the lower portion of the manufacturing room 24. A disk-type isolation valve 40 pivotally supported at one end is installed at the front portion of the gate chamber 42. By this arrangement, opening and closing between the manufacturing room 24 and the retaining room 22 can be performed.

A retaining room door 44 for collecting produced spherical semiconductor crystals 64c is installed at the front portion of the retaining room 22. A protruded gas inlet-port 46 for guiding inert gas into the retaining room 22 is installed in the upper lateral surface of the retaining room 22. Furthermore, a base chamber 45 is disposed at the lower end of the retaining room 22, and an exhaust port 48 installed on the base chamber 45 is connected to a vacuum pump 47 via an electromagnetic valve 43. Moreover, exhaust ports 55a, 55b and 55c are respectively installed on the material room 26, the manufacturing room 24 and the retaining room 22. The exhaust ports 55a, 55b and 55c are respectively connected to a sub-pump 49 via electromagnetic valves 51a, 51b and 51c. By this arrangement, replacement of inert gas and adjustment of vacuum pressure can be performed by combining the above-described equipment with the inert gas inlet-ports 34, 38, 46 and isolation valves 40 and 54 (see FIG. 1).

Figure 1:
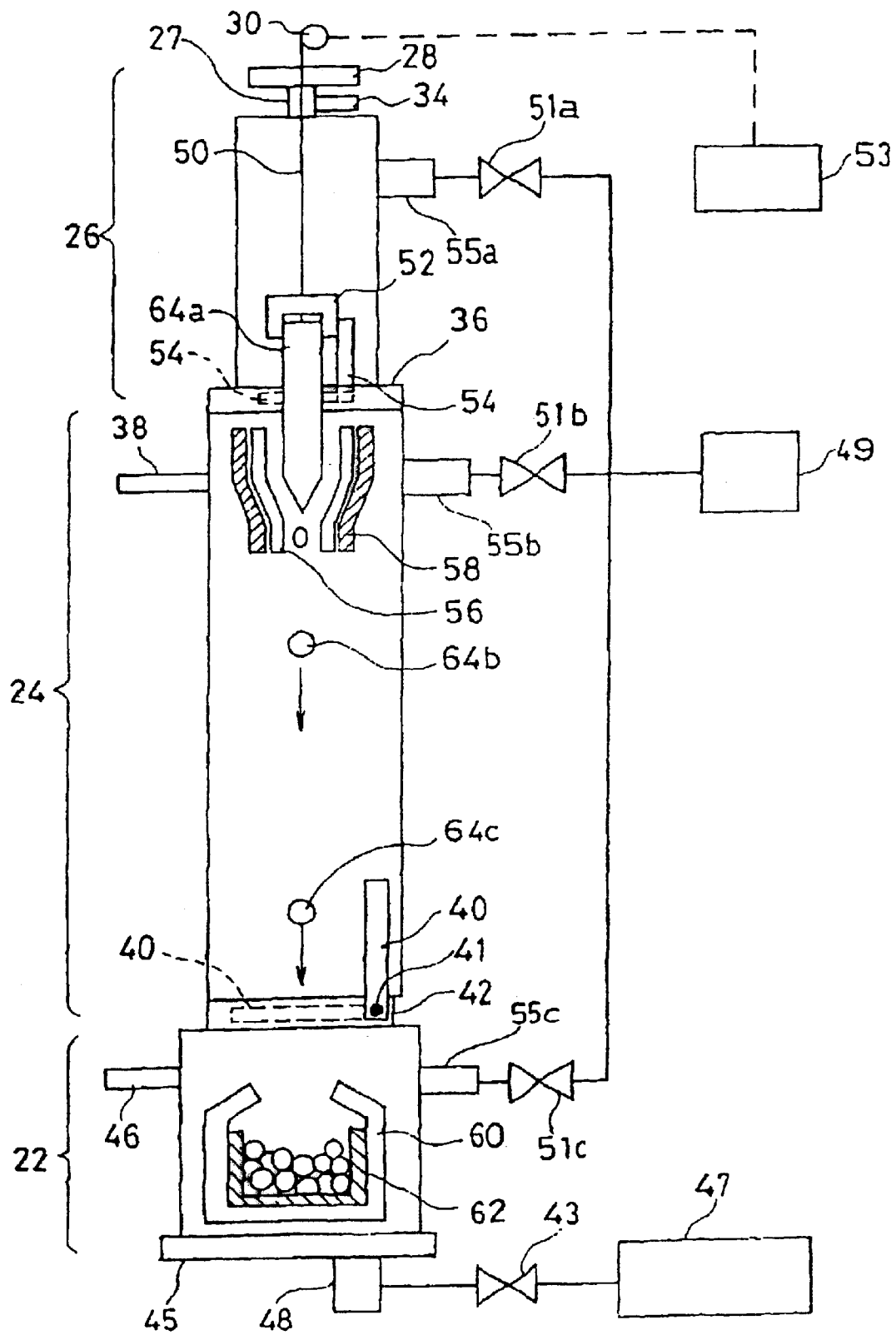
FIG. 1 is an illustration showing the first embodiment of the device for manufacturing spherical semiconductor crystals according to this invention.

The following is a description concerning the interior of the embodiment of the device 20 for manufacturing spherical semiconductor crystals. FIG. 1 is an illustration showing the embodiment of the device 20 for manufacturing spherical semiconductor crystals.

The wire 50 being supported by the wire-winding device 30 extends into the material room 26 by passing through a base 28 and the cylinder 27. The lower end of the wire 50 is connected with a chuck 52 having an inverted "U" shape cross section. The chuck 52 employed as a clamping member is disposed at the central portion of the material room 26. In this embodiment, the chuck 52 is made of carbon-fiber-reinforced carbon material having a melting point higher than that of silicon semiconductor material or metals, such as Mo, with high melting points. Therefore, the chuck 52 will not melt at the melting point of the bar-shaped silicon semiconductor material 64a, and heat damage such as distortion of the chuck 52 can be eliminated. The bar-shaped semiconductor material 64a is installed within the chuck 52 and thus ascends/descends integrally with the wire 50. The controller 53 used for controlling the wire winding device 30 has two speed modes, namely a fast-speed mode during quick shifting and a slow-speed mode during melting. By this, the descending speed of the bar-shaped semiconductor material 64a supported by the wire 50 can be adjusted.

An isolation valve 54 pivotally supported at one end is installed on the gate chamber 36 of the manufacturing room 24 so as to enable refilling of the bar-shaped semiconductor material 64a. In other words, the isolation valve 54 can perform isolation of the manufacturing room 24 and the material room 26. Therefore, the material room 26 can be opened and then closed to refill the bar-shaped semiconductor material 64a while keeping the Argon atmosphere in the manufacturing room 24 unchanged. A heater 56 used for preheating and melting the bar-shaped semiconductor material 64a is installed in the upper portion of the manufacturing 30 room 24, and an adiabatic material 58 having the same shape as that of the heater 56 is disposed therearound. Their detailed structure will be described hereinafter.

A receiving container 60 used for retaining spherical semiconductor crystals 64c is disposed in the central portion of the retaining room 22. An impact absorbing material 62 having a U-shaped cross section is disposed within the receiving container 60. The impact absorbing material 62 is used for absorbing the impact induced by the fall of the spherical semiconductor crystals 64c. Furthermore, the manufacturing room 24 and the retaining room 22 can be isolated by the isolation valve 40 so that the spherical semiconductor crystals 64c can be taken out while keeping Argon atmosphere in the manufacturing room 24 unchanged.

Figure 2:
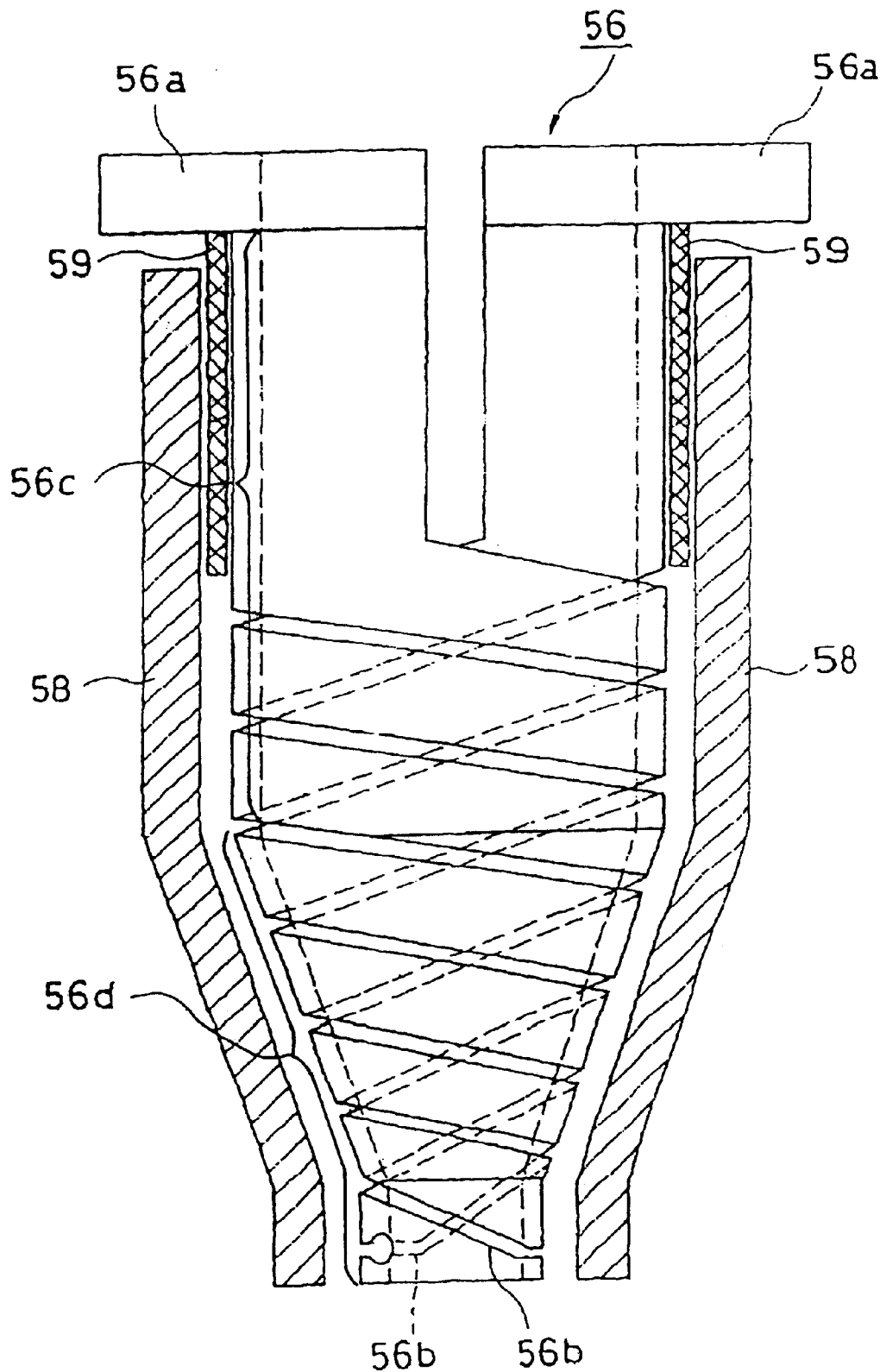
FIG. 2 is an illustration showing an embodiment of the heater according to this invention.

FIG. 2 is an illustration showing the heater 56 according to this embodiment. The heater 56 comprises a cylindrical preheating portion 56c and a melting portion 56d having a sharpened end whose acute angle is the same as that of the end portion of the bar-shaped semiconductor material 64a. In this embodiment, the acute angle of the end portion of the bar-shaped semiconductor material 64a is between 50° and 55°, and the acute angle of the melting portion 56d of the heater is the same. A protruded flange 56a connected with an electric power source (not shown) is disposed on the top surface of the preheating portion 56c. In this embodiment, the melting portion 56d of the heater 56 has a double-spiral shape. Namely, each of the two slits 56b is formed in the melting portion 56d in a helical shape so as to mold the heat-emission body into a double-spiral shape. By this arrangement, heat emission efficiency of the heater 56 can be enhanced, and preheating and melting of the bar-shaped semiconductor material 64a can be performed in an efficient and axial-symmetrical manner. In this embodiment, the heater 56 is graphite-made resistance heating heater and is coated with a coating material, such as silicon carbide, on its surface. This can prevent oxidation of the heater 56 and extend lifetime of the heater 56.

Figure 3:
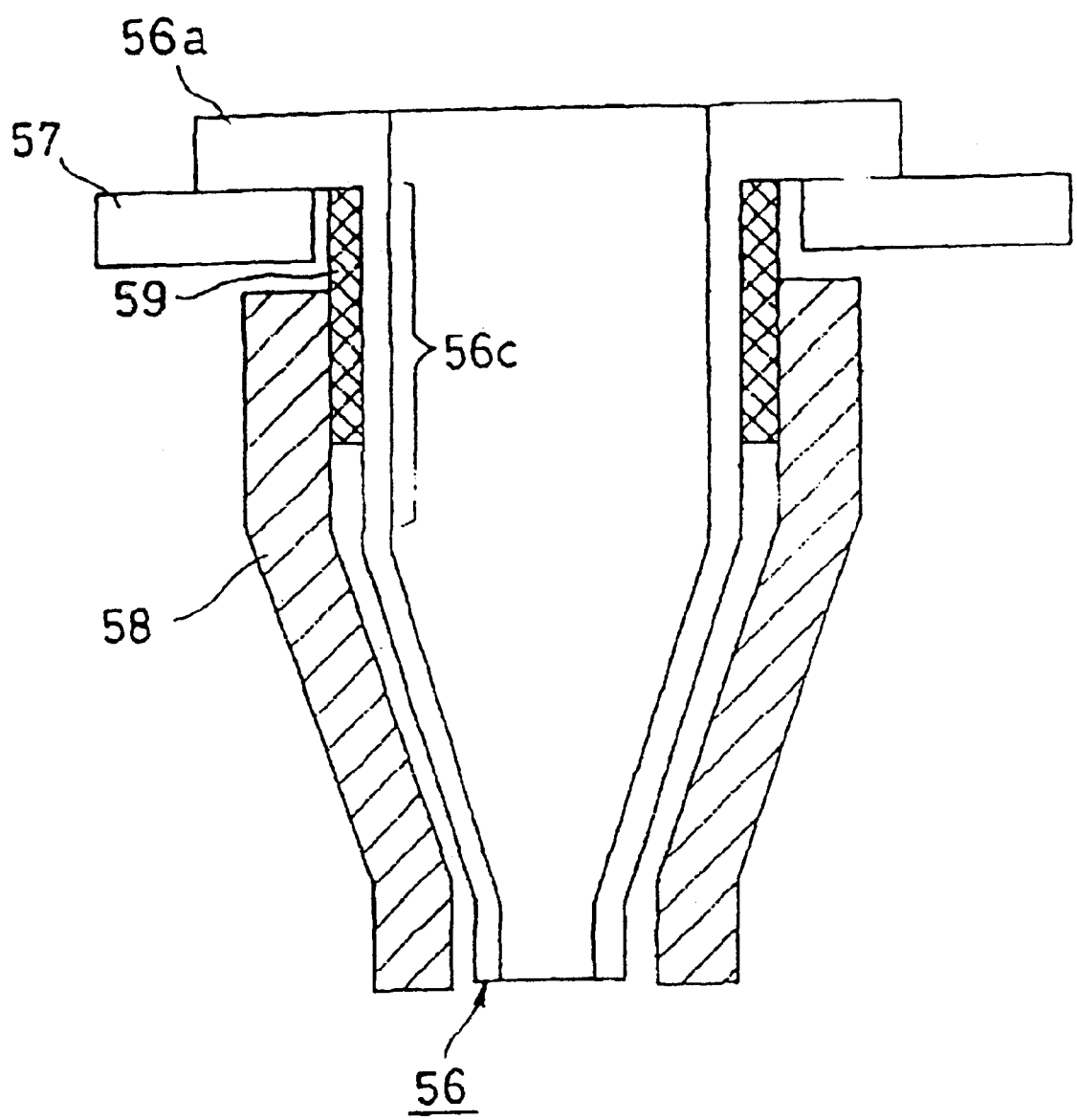
FIG. 3 is an illustration showing the structure of the neighborhood of the heater according to this invention.

FIG. 3 is an illustration showing the structure of the neighborhood of the heater 56. A conductive plate 57 connecting with an electric power source (not shown) is disposed beneath the lower portion of the flange 56a so as to deliver electric power to the heater 56. An adiabatic material 58 made of graphite fibers and having the same shape as that of the heater 56 is disposed around the heater 56. The adiabatic material 58 is used for keeping the periphery of the heater 56 warm. A tube-shaped insulating body 59 made of quartz is interposed between the outer periphery of the preheating portion 56c of the heater 56 and the adiabatic material 58 so as to keep the adiabatic material 58 in an insulated state. Furthermore, the heater 56 is installed in the manufacturing room 24 via the adiabatic material 58.

Figure 5A:
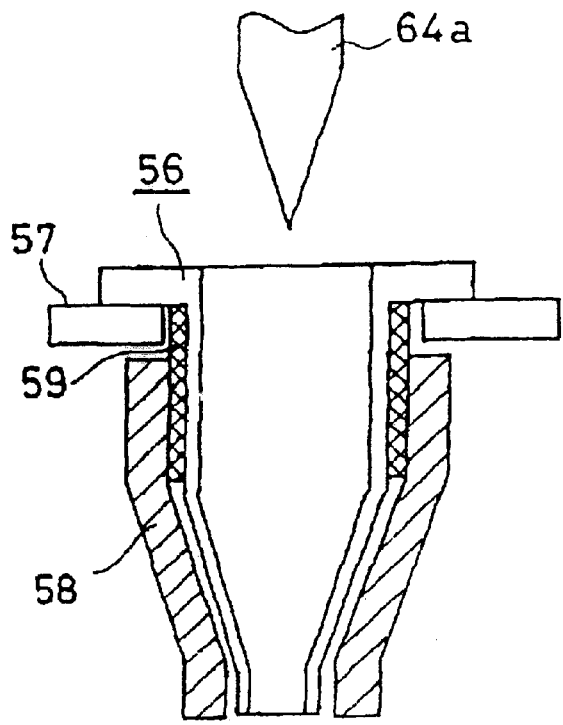
FIGS. 5a, 5b, 5c and 5d are illustrations showing the steps of manufacturing spherical semiconductor crystals in the first embodiment according to this invention.

In the above-described structure, the process of manufacturing spherical semiconductor crystals is as follows. The device 20 for manufacturing spherical semiconductor crystals is filled with inert gas, such as Argon gas, so as to prevent oxidation of the heater 56 and the bar-shaped semiconductor material 64a. FIGS. 5a, 5b, 5c and 5d are illustrations showing the steps of manufacturing spherical semiconductor crystals in this embodiment. At first, the bar-shaped semiconductor material 64a with a sharpened lower end is inserted into the material room 26 by way of the material room door 32 and is conducted to be clamped by the chuck 52. The lower end of the bar-shaped semiconductor material 64a is shaped into a shape the same as that of the melting portion 56d of the heater 56. Furthermore, the whole outer surface of the bar-shaped semiconductor material 64a has been finished by chemical polishing. Then, as shown in FIG. 5a, the bar-shaped semiconductor material 64a is kept standing above the heater 56, and the heater 56 is actuated to raise its temperature.

Figure 5B:
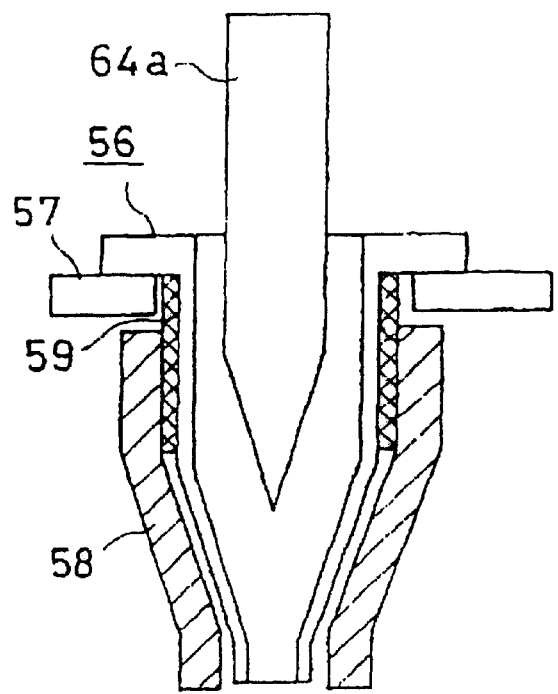
Figure 5C:
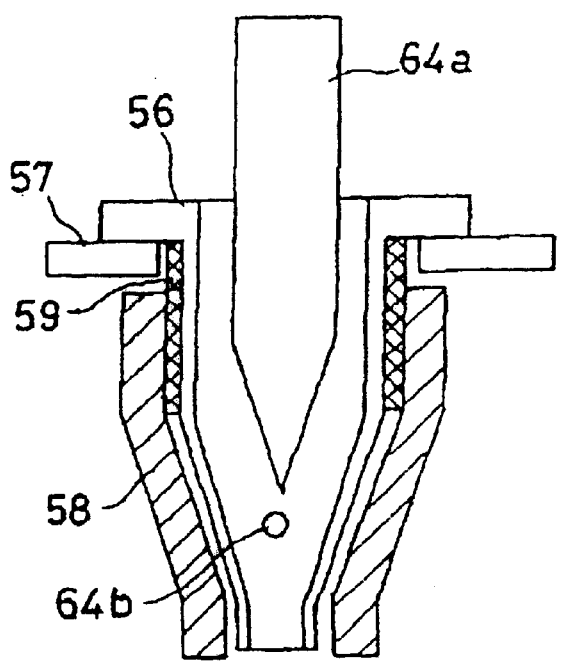
Figure 5D:
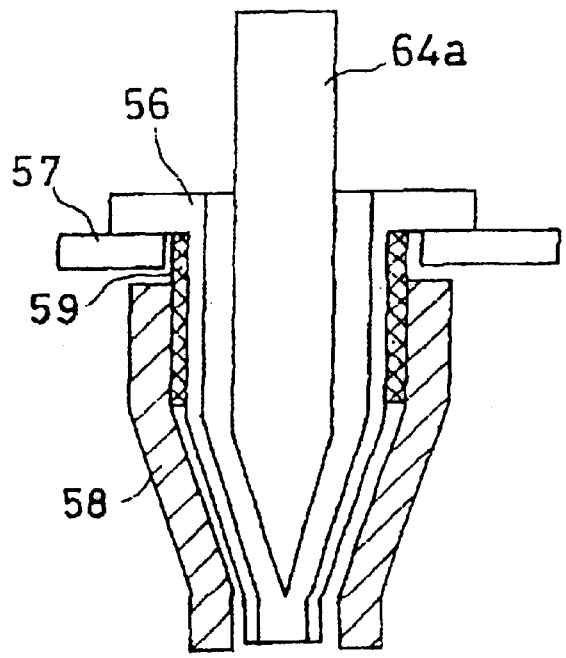

Subsequently, as shown in FIG. 5b, the bar-shaped semiconductor material 64a descends rapidly to its preheating position to perform preheating adequately within the preheating portion of the heater 56. By preheating the bar-shaped semiconductor material 64a, breakage of the bar-shaped semiconductor material 64a induced by an abrupt temperature rise can be prevented. In this embodiment, preheating process is performed by heating the bar-shaped semiconductor material 64a from about 600° C. to 700° C in a time duration of more than one hour. Afterward, the preheated bar-shaped semiconductor material 64a further descends at a preset low speed to enter the melting zone of the melting portion 56d of the heater 56.

The outer surface of the sharpened end of the bar-shaped semiconductor material 64a melts by virtue of the heat emitted from the melting portion 56d of the heater 56 and the melted material (melted liquid) accumulates at the sharpened lower end and converts into a liquid drop 64b. At the time the liquid drop 64b reaches a certain weight, the liquid drop 64b drops off the lower end of the bar-shaped semiconductor material 64a and falls due to its own weight (see FIG. 5c). Then, the bar-shaped semiconductor material 64a descends a distance corresponding to the amount of the melted material dropped off and the process for melting and forming drops can thus be continuously performed.

Figure 6A:
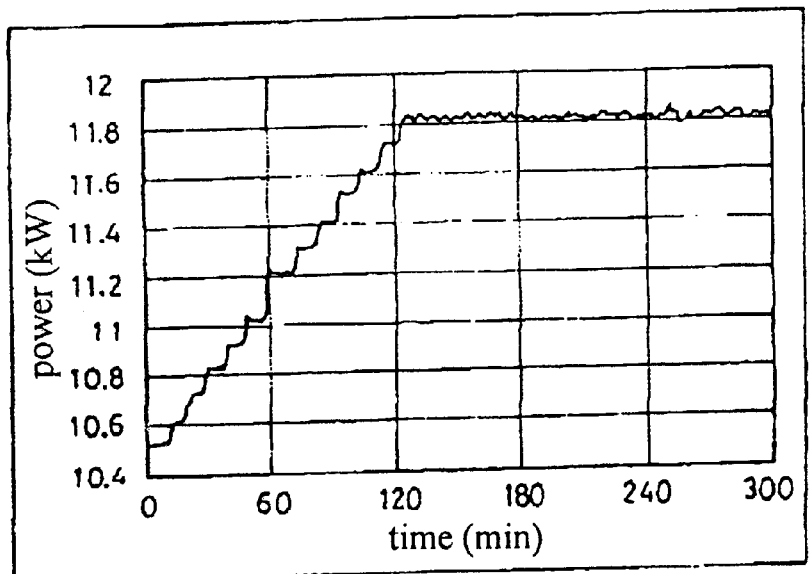
FIGS. 6a, 6b and 6c are graphs showing the conditions during melting of bar-shaped material.
Figure 6B:
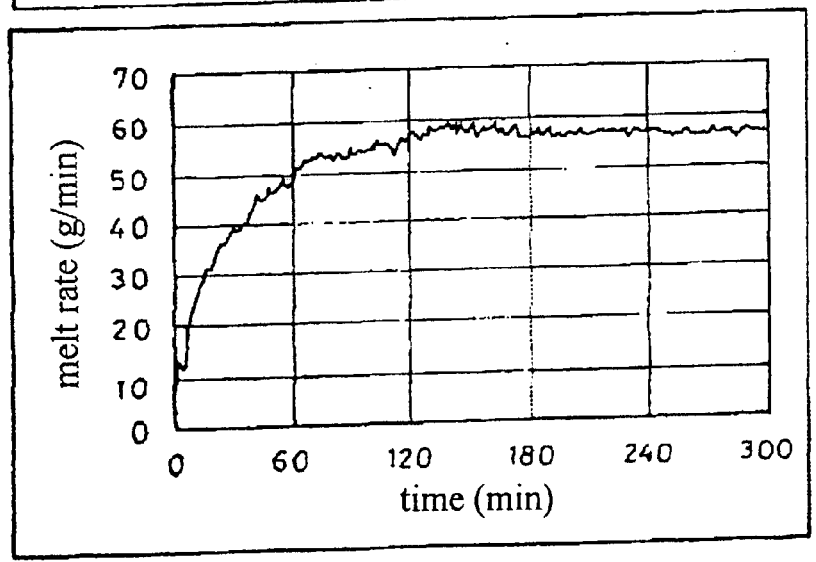
Figure 6C:
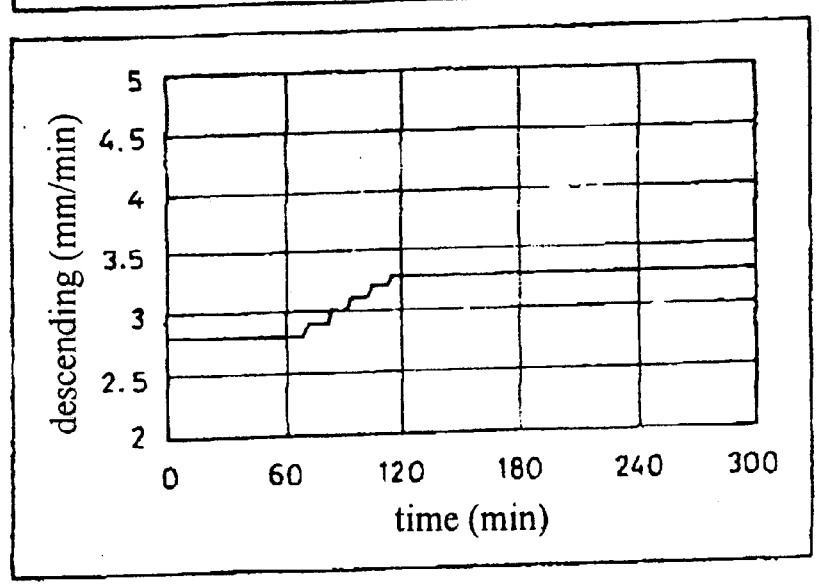

Namely, in this embodiment, the amount of material dropped off in the liquid drop 64b is detected by for example a weight sensor (not shown) and is inputted into the controller 53. The controller 53 controls the wire-winding device 30, which conducts the bar-shaped semiconductor material 64a to descend toward the melting portion 56d by an distance corresponding to the amount of material dropped off by the liquid drop 64b. FIGS. 6a, 6b and 6c are graphs showing melting conditions of the bar-shaped semiconductor material 64a starting from the termination of preheating process. The bar-shaped semiconductor material 64a whose conditions are shown in the above graphs is 4 inches in diameter, and material resistance is 10 Ω·cm. Furthermore, the bar-shaped semiconductor material 64a is not in a rotated state. In FIG. 6a, the vertical axis denotes the power of the heater 56 per unit time. In FIG. 6b, the vertical axis denotes the amount of material dropped in the form of liquid drops 64b per unit time. In FIG. 6c, the vertical axis denotes the descending speed of the bar-shaped semiconductor material 64a. The horizontal axes of FIGS. 6a, 6b and 6c respectively denote time duration. The origins of the horizontal axes are set at the termination of the preheating process. As shown in FIG. 6a, if the power of the heater 56 is increased from 0 minute to 120 minutes, then the amount of material dropping off in the form of liquid drops 64b increases (see FIG. 6b). The descending speed of the bar-shaped semiconductor material 64a is increased by the conducting of the controller 53 so as to be in line with the increased amount of the material dropping down in the form of liquid drops 64b (see FIG. 6c). After 120 minutes has passed from the beginning of melting of material, the melting speed reaches a predetermined value. Then, the power of the heater 56, the amount of material dropping off in the form of liquid drops 64b, and the descending speed of the bar-shaped semiconductor material 64a are respectively kept at a substantially invariant value. Therefore, the distal end of the bar-shaped semiconductor material 64a maintains its tapered shape during the melting process, and liquid drops 64b are continuously produced. The liquid drops 64b cool down during free fall and become solid spherical semiconductor crystals 64c without deformation. The solidified spherical semiconductor crystals 64c drop into the receiving container 60 and are detained by the impact absorbing material 62, which is installed in the receiving container 60 for absorbing the impact induced by the fall of the spherical semiconductor crystals 64c. The spherical semiconductor crystals 64c are thus produced through the above-described process.

As described above, during the melting of the bar-shaped semiconductor material 64a, melted semiconductor material accumulates at the distal end of the bar-shaped semiconductor material 64a and then converts into liquid drops 64b. Accordingly, spherical semiconductor crystals 64c can be continuously and directly produced from semiconductor material. Moreover, spherical semiconductor crystals 64c can be produced continuously without contamination. In conventional processes, two steps are required to drop liquid drops 64 during the process of melting material. Namely, melt liquid is temporarily stored and then puffed out from the distal end of the nozzle by applying a gas pressure. According to this invention, two steps are not required, thus the number process is simplified.

Furthermore, melted semiconductor material can be conducted to form liquid drops at the distal end of the bar-shaped semiconductor material by sharpening the lower end of the bar-shaped semiconductor material beforehand. By this, dropping of liquid drops can be precisely conducted. Therefore, short-circuiting between heater slits induced by splattering of liquid drops or excessive reduction of heater lifetime can be avoided.

Figure 7:
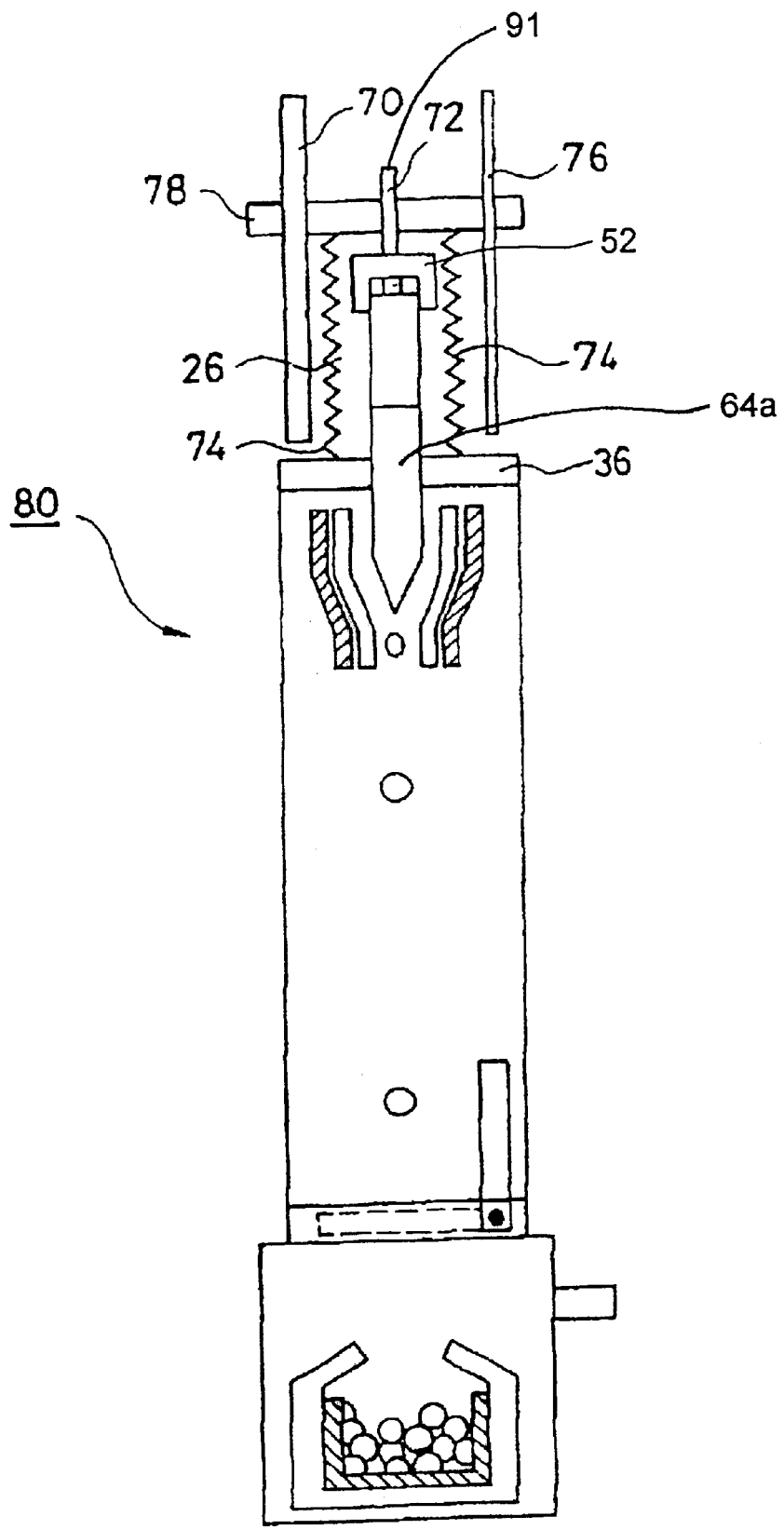
FIG. 7 is an illustration showing the second embodiment of the device for manufacturing spherical semiconductor crystals according to this invention.

FIG. 7 is an illustration showing the second embodiment of the device for manufacturing spherical semiconductor crystals according to this invention. In this embodiment, the material room 26 is constructed by a bellows 74 and the bar-shaped semiconductor material 64a is conducted to ascend/descend by a ball screw 70. Namely, in the device 80 for manufacturing spherical semiconductor crystals, the upper end of the bar-shaped semiconductor material 64a is retained by the chuck 52 and connects with a shaft 72 inserting through the central portion of the chuck 52. A weight sensor (load cell) 91 connected to the upper portion of the shaft 72 is used to monitor the weight of the bar-shaped semiconductor material. The upper portion of the shaft 72 is held by a base 78, and the shaft 72 ascends or descends integrally with the base 78. The base 78 is connected with the upper end of the bellows 74, which is connected with the gate chamber 36, and supports the bellows 74 by its upper end. Furthermore, inert gas such as Argon gas can be guided into the interior of the bellows 74 via a communicating passage (not shown). A guide member 76 is installed at one end portion of the base 78 so as to guide the base 78 during its ascending or descending movement. Furthermore, the ball screw 70 connected to a controller (not shown) is engaged with and passes through the other end of the base 78. The upper end of the ball screw 70 is connecting to a driving source, which is controlled by the controller (not shown). In addition, the bar-shaped semiconductor material 64a is conducted to ascend/descend by the ball screw 70, which is rotated by the driving source.

Figure 8A:
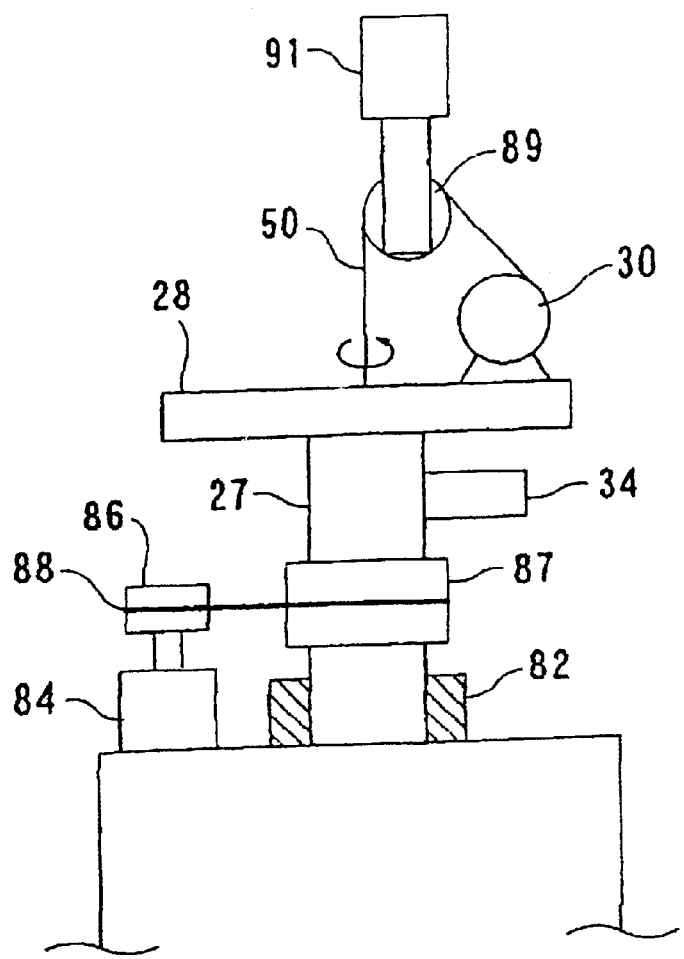
FIGS. 8a and 8b are illustrations respectively showing the rotation mechanisms in the embodiments of this invention.
Figure 8B:
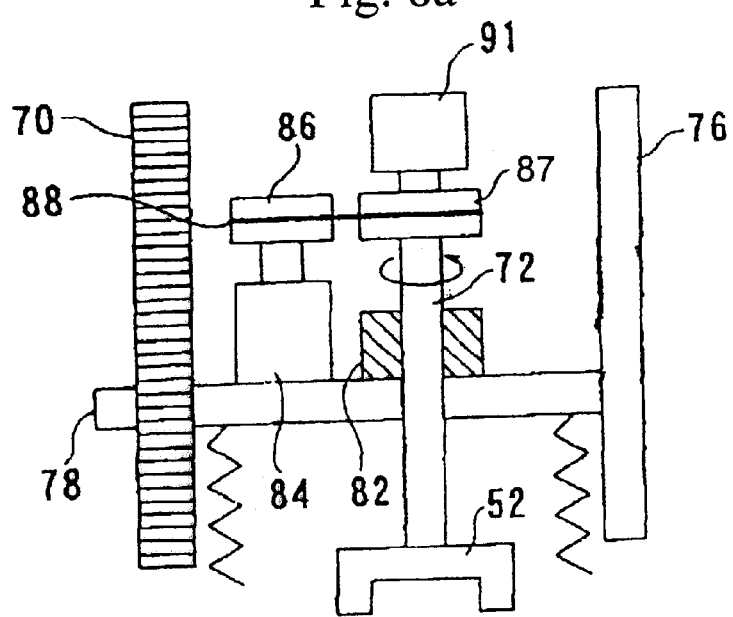

In the above embodiments, the bar-shaped semiconductor material 64a is not rotated during the melting process. However, it is also acceptable to rotate the bar-shaped semiconductor material 64a during the melting process. FIGS. 8a and 8b are illustrations respectively showing the rotation mechanisms in the first and second embodiments of this invention.

In the first embodiment, the wire 50 supports the bar-shaped semiconductor material 64a. A rotation motor 84 provided with a driving pulley 86 is installed on the top surface of the material room 26. A driven pulley 87 is installed on the cylinder 27 at the same height as that of the driving pulley 86, and a magnetic shield 82 is installed below the cylinder 27. A belt 88 is wrapping around the driving pulley 86 and the driven pulley 87 so as to enable the driving pulley 86 and the driven pulley 87 to be integrally rotated. Moreover, the wire-winding device 30 is affixed on the top surface of the base 28, and the wire 50 is suspended along the rotation axis by a suspending pulley 89. By this arrangement, the rotation force of the rotation motor 84 is transmitted from the driving pulley 86 to the driven pulley 87 via the belt 88. Accordingly, the bar-shaped semiconductor material 64a supported by the wire 50 and the wire-winding device 30 affixed on the top surface of the base 28 are integrally rotated. The bar-shaped semiconductor material 64a supported by the wire 50 is rotated around the rotation axis because the suspending pulley 89 suspends the wire 50 along the rotation axis. Furthermore, the weight sensor 91 is connected to the suspending pulley 89 so as to monitor the weight of the bar-shaped semiconductor material.

As shown in FIG. 8b, in the event of supporting the bar-shaped semiconductor material 64a by the shaft 72, the rotation motor 84 having a coaxial relationship with the driving pulley 86 is installed on the top surface of the base 78. The driven pulley 87 is installed on the shaft 72 at the same height as that of the driving pulley 86, and the magnetic shield 82 is installed below the shaft 72. The belt 88 is wrapping around the driving pulley 86 and the driven pulley 87. By this arrangement, the rotation force of the rotation motor 84 is transmitted to the shaft 72 and the bar-shaped semiconductor material 64*a* is capable of being integrally rotated with the shaft 72.

As described above, by installing a rotation mechanism capable of rotating the bar-shaped semiconductor material 64*a* at a preset speed on the supporting member (wire 50) or the shaft 72, the bar-shaped semiconductor material 64*a* can be heated to melt during its rotation at a preset speed. Therefore, the bar-shaped semiconductor material 64*a* can be uniformly melted.

Furthermore, the resistivity of the spherical semiconductor crystals can be adjusted by doping a certain amount of dopants (for example, boron for manufacturing p-type semiconductors, and phosphorus or arsenic for manufacturing n-type semiconductors) into the bar-shaped semiconductor material. Thus, it is possible to produce p-type or n-type semiconductors. The above purpose can be achieved by mixing dopants into the bar-shaped semiconductor material through thermal decomposition or spreading a certain amount of dopants over a semiconductor material so as to acquire a desired resistance. Furthermore, quartz storage parts or graphite susceptors are no longer required, therefore cost can be reduced. Optionally, doping gas (for example, in the event of p-type, diborane $B_2H_6$ is used. In the event of n-type, arsenic hydride $AsH_3$ or hydrogen phosphide $PH_3$ is used) can be guided into the manufacturing room from a doping gas source (not shown), and doping gas can be mixed in a preset proportion into the surroundings of the liquid drops. By this, the resistivity of the spherical semiconductor crystals can be adjusted to produce p-type or n-type semiconductors.

Furthermore, it is acceptable to set melting conditions for the bar-shaped semiconductor material by keeping the power of the heater and the descending speed of the bar-shaped semiconductor material invariant. It is also satisfactory to change the power of the heater and the descending speed of the bar-shaped semiconductor material during the melting process. It is also allowable to rotate the bar-shaped semiconductor material during the melting process. Moreover, it is acceptable to polish the whole outer periphery of the bar-shaped semiconductor material. It is also allowable to polish only the distal end of the bar-shaped semiconductor material.

As described above, according to the method and the device for manufacturing spherical semiconductor crystals of this invention, spherical semiconductor crystals can be produced continuously without contamination. In addition, deterioration of the manufacturing device can be impeded.

What is claimed is:

1. A device for manufacturing spherical semiconductor crystals, comprising a supporting member for supporting semiconductor material in a manner capable of ascending/descending at a preset speed;

a heater disposed below the supporting member without contacting the semiconductor material for melting the semiconductor material to be changed into liquid which drops down from the distal end of the semiconductor material in the form of liquid drops;

a manufacturing room allowing the liquid drops to solidify during free fall; and a controller for conducting the semiconductor material to descend toward the heater with the aid of the supporting member in response to the amount of the semiconductor material dropped.

2. The device as claimed in claim 1, wherein the lower portion of the manufacturing room is provided with an impact absorbing member used for absorbing the impact of the falling spherical semiconductor crystals solidified from the liquid drops and retaining them.

3. The device as claimed in claim 1, wherein the semiconductor material is in the shape of a bar.

4. The device as claimed in claim 3, wherein the lower end of the semiconductor material is sharpened, the lower end of the heater is devised as a melting portion, and the lower end of the heater is sharpened in the same way as the lower end of the semiconductor material, and the upper section of the melting portion is employed for preheating the semiconductor material.

5. The device as claimed in claim 3, wherein the supporting member is provided with a rotation mechanism capable of rotating the semiconductor material at a preset speed.

6. The device as claimed in claim 1, wherein the clamping portion of the supporting member is made of carbon-fiber-reinforced carbon material having a melting point higher than that of semiconductor material or metals with high melting points.

7. The device as claimed in claim 1, wherein the heat-emission body in the melting portion of the heater is in a double-spiral shape.

8. The device as claimed in claim 1, wherein the supporting member is provided with a rotation mechanism capable of rotating the semiconductor material at a preset speed.

9. The device as claimed in claim 1, wherein a doping gas is communicated with the manufacturing room.

* * * * *